US011815402B2

(12) United States Patent
Van Der Post et al.

(10) Patent No.: US 11,815,402 B2
(45) Date of Patent: Nov. 14, 2023

(54) WAVEFRONT SENSOR AND ASSOCIATED METROLOGY APPARATUS

(71) Applicant: ASML Netherlands B.V., Veldhoven (NL)

(72) Inventors: Sietse Thijmen Van Der Post, Utrecht (NL); Peter Danny Van Voorst, Nijmegen (NL)

(73) Assignee: ASML Netherlands B.V., Veldhoven (NL)

( * ) Notice: Subject to any disclaimer, the term of this patent is extended or adjusted under 35 U.S.C. 154(b) by 160 days.

(21) Appl. No.: 17/425,646

(22) PCT Filed: Dec. 19, 2019

(86) PCT No.: PCT/EP2019/086296
§ 371 (c)(1),
(2) Date: Jul. 23, 2021

(87) PCT Pub. No.: WO2020/151891
PCT Pub. Date: Jul. 30, 2020

(65) Prior Publication Data
US 2022/0099498 A1    Mar. 31, 2022

(30) Foreign Application Priority Data
Jan. 25, 2019  (EP) ..................... 19153671

(51) Int. Cl.
*G01J 9/00*    (2006.01)
*G01N 23/207*    (2018.01)
(Continued)

(52) U.S. Cl.
CPC .............. *G01J 9/00* (2013.01); *G01N 23/207* (2013.01); *G02B 3/0037* (2013.01);
(Continued)

(58) Field of Classification Search
CPC .... G01J 9/00; G01J 2009/002; G01N 23/207; G02B 3/0037; G02B 5/1819;
(Continued)

(56) References Cited

U.S. PATENT DOCUMENTS 9,386,675 B2    7/2016 Suzuki et al.
10,067,068 B2    9/2018 Den Boef et al.
(Continued)

FOREIGN PATENT DOCUMENTS

DE    102006007172 B4    8/2007
EP     3 296 723 A1    3/2018
(Continued)

OTHER PUBLICATIONS

International Search Report and Written Opinion of the International Searching Authority directed to related International Patent Application No. PCT/EP2019/086296, dated Apr. 1, 2020; 11 pages.
(Continued)

*Primary Examiner* — David P Porta
*Assistant Examiner* — Mamadou Faye
(74) *Attorney, Agent, or Firm* — Sterne, Kessler, Goldstein & Fox P.L.L.C.

(57) ABSTRACT

Disclosed is a wavefront sensor for measuring a tilt of a wavefront at an array of locations across a beam of radiation, wherein said wavefront sensor comprises a film, for example of Zirconium, having an indent array comprising an indent at each of said array of locations, such that each indent of the indent array is operable to perform focusing of said radiation. Also disclosed is a radiation source and inspection apparatus comprising such a wavefront sensor.

15 Claims, 8 Drawing Sheets

(51) Int. Cl.
  *G02B 3/00* (2006.01)
  *G02B 5/18* (2006.01)
  *G03F 7/00* (2006.01)
  *G21K 1/06* (2006.01)
(52) U.S. Cl.
  CPC ......... *G02B 5/1819* (2013.01); *G02B 5/1838* (2013.01); *G03F 7/70616* (2013.01); *G21K 1/065* (2013.01); *G01J 2009/002* (2013.01)
(58) Field of Classification Search
  CPC .. G02B 5/1838; G02B 3/0056; G02B 3/0068; G02B 3/0075; G02B 5/1814; G03F 7/70616; G03F 7/706; G21K 1/065; H05G 2/00
  See application file for complete search history.

(56) References Cited

U.S. PATENT DOCUMENTS

| | | | |
|---|---|---|---|
| 2004/0196450 A1 | 10/2004 | Levecq et al. | |
| 2006/0109533 A1 | 5/2006 | Schriever et al. | |
| 2008/0007836 A1* | 1/2008 | Lu | G02B 3/0012 359/619 |
| 2010/0020302 A1* | 1/2010 | Freimann | G01J 1/0411 355/68 |
| 2010/0309354 A1* | 12/2010 | Tsuduki | H04N 23/54 348/294 |
| 2012/0229688 A1* | 9/2012 | Tajiri | G02B 3/0056 348/335 |
| 2014/0252240 A1 | 9/2014 | Baker | |
| 2016/0109290 A1 | 4/2016 | Klennert | |
| 2016/0282282 A1 | 9/2016 | Quintanilha et al. | |
| 2017/0045823 A1 | 2/2017 | Quintanilha | |
| 2018/0348145 A1 | 12/2018 | Witte et al. | |
| 2021/0197504 A1* | 7/2021 | Tazawa | G02B 5/0231 |

FOREIGN PATENT DOCUMENTS

| | | |
|---|---|---|
| EP | 3 321 739 A1 | 5/2018 |
| EP | 3 410 211 A1 | 12/2018 |
| JP | 2006-032692 A | 2/2006 |
| JP | 2017-009437 A | 1/2017 |
| RU | 2036491 C1 | 5/1995 |
| WO | WO 2014/097811 A1 | 6/2014 |
| WO | WO 2015/172963 A1 | 11/2015 |
| WO | WO 2017/025392 A1 | 2/2017 |
| WO | WO 2017/108404 A1 | 6/2017 |
| WO | WO 2017/108410 A1 | 6/2017 |

OTHER PUBLICATIONS

International Preliminary Report on Patentability directed to related International Patent Application No. PCT/EP2019/086296, dated Jul. 27, 2021; 9 pages.

Naulleau et al., "Extreme-ultraviolet phase-shifting point-diffraction interferometer: a wave-front metrology tool with subangstrom reference-wave accuracy," Applied Optics, vol. 38, No. 35, Dec. 10, 1999; pp. 7252-7263.

Braig et al., "An EUV beamsplitter based on conical grazing incidence diffraction," Optics Express, vol. 20, No. 2, Jan. 12, 2012; pp. 1825-1838.

Hartmann Wavefront Analyzer Tutorial, Spiricon Laser Beam Diagnostics, Part No. 10885-001, Rev. D, 2004; 19 pages.

Mann et al., "Hartmann wavefront sensor for EUV radiation," Extreme Ultraviolet (EUV) Lithography IV, Proceedings of SPIE, vol. 8679, No. 967922, Apr. 1, 2013; pp. 1-9.

Baker, Kevin L., "X-ray wavefront characterization with two-dimensional wavefront sensors: shearing interferometers and Hartmann wavefront sensors," Optical Engineering, vol. 52, No. 2, Feb. 18, 2013; pp. 1-9.

Mercère et al., "Hartmann wave-front measurement at 13.4 nm with EUV/120 accuracy," Optics Letters, vol. 28, No. 17, Sep. 1, 2003; pp. 1534-1536.

Frumker et al., "Frequency-resolved high-harmonic wavefront characterization," Optics Letters, vol. 34, No. 19, Oct. 1, 2009; pp. 3026-3028.

Austin et al., "Lateral shearing interferometry of high-harmonic wavefronts," Optics Letters, vol. 36, No. 10, May 15, 2011; pp. 1746-1748.

Wikipedia—Shack-Hartmann wavefront sensor, last updated Jan. 21, 2017; 1 page.

Freisem et al., "Spectrally resolved single-shot wavefront sensing of broadband high-harmonic sources," Optics Express, vol. 26, No. 6, Mar. 19, 2018; pp. 6860-6871.

Polo et al., "Wavefront measurement for EUV lithography system through Hartmann sensor," Proceedings of SPIE, vol. 7971, Metrology, Inspection, and Process Control for Microlithography XXV, Apr. 20, 2011; pp. 1-7.

Polo et al., "Subaperture phase reconstruction from a Hartmann wavefront sensor by phase retrieval method for application in EUV adaptive optics," Proceedings of SPIE, vol. 8322, Extreme Ultraviolet (EUV) Lithography III, Mar. 23, 2012; pp. 1-9.

Baker, Kevin L., "X-ray wavefront characterization with two-dimensional wavefront sensors: shearing interferometers and Hartmann wavefront sensors," Proceedings of SPIE, vol. 8503, Adaptive X-Ray Optics II, Oct. 15, 2012; pp. 1-11.

Keitel et al., "Hartmann wavefront measurements at FLASH," Proceedings of SPIE, vol. 8778, Advances in X-ray Free-Electron Lasers II: Instrumentation, May 3, 2013; pp. 1-7.

Mayo et al., "Refractive microlens array for wave-front analysis in the medium to hard x-ray range," Optics Letters, vol. 29, No. 8, Apr. 15, 2004; pp. 866-868.

Künzel et al., "Shot-to-shot intensity and wavefront stability of high-harmonic generation," Applied Optics, vol. 54, No. 15, May 20, 2015; pp. 4745-4749.

FLöter et al., "EUV Hartmann sensor for wavefront measurements at the Free-electron LASer in Hamburg," New Journal of Physics, vol. 12, Aug. 9, 2010; pp. 1-13.

* cited by examiner

WAVEFRONT SENSOR AND ASSOCIATED METROLOGY APPARATUS

CROSS REFERENCE TO RELATED APPLICATIONS

This application claims priority of EP application 19153671.3 which was filed on 2019 Jan. 25 and which is incorporated herein in its entirety by reference.

FIELD

The present disclosure relates to methods and apparatus for inspection (e.g., metrology) usable, for example, in the manufacture of devices by lithographic techniques and to methods of manufacturing devices using lithographic techniques.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields".

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay, the accuracy of alignment of two layers in a device. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a diffraction "spectrum" from which a property of interest of the target can be determined.

At the same time, the known inspection techniques employ radiation in the visible or ultraviolet waveband. This limits the smallest features that can be measured, so that the technique can no longer measure directly the smallest features made in modern lithographic processes. To allow measurement of smaller structures, it has been proposed to use radiation of shorter wavelengths, similar for example to the extreme ultraviolet (EUV) wavelengths used in EUV lithography. Such wavelengths may be in the range 1 to 100 nm, for example, or 1-125 nm. Part or all of this wavelength range may also be referred to as soft x-ray (SXR) wavelengths. Some authors may use SXR to refer to a narrower range of wavelengths, for example in the range 1-100 nm, 1-50 nm, 1-20 nm or 10-20 nm. For the purposes of the present disclosure, these terms SXR and EUV will be used without implying any hard distinction. Metrology using harder x-rays, for example in the range 0.1-1 nm is also contemplated. Examples of transmissive and reflective metrology techniques using these wavelengths in transmissive and/or reflective scattering modes are disclosed in published patent application WO2015172963A1. Further examples of metrology techniques and apparatuses using these wavelengths in transmissive and/or reflective scattering modes are disclosed in the published patent applications US2016282282A1, US2017045823A1 and WO2017025392A1 and in the international patent application number PCT/EP2016/080058, not yet published at the present priority date. The contents of all these applications are incorporated herein by reference.

Convenient sources of SXR radiation include higher harmonic generation (HHG) sources, in which infrared pump radiation from a laser is converted to shorter wavelength radiation by interaction with a gaseous medium. HHG sources are available for example from KMLabs, Boulder Colorado, USA (http://www.kmlabs.com/). Various modifications of HHG sources are also under consideration for application in inspection apparatus for lithography. Some of these modifications are disclosed for example in European patent application EP3321739. Other modifications are disclosed in international patent application WO 2017/108410. European patent application EP3296723 describes the correction of wavefronts in an HHG radiation source to minimize blurring of the measurement spot in an inspection apparatus. The contents of all of these applications are incorporated herein by reference.

A wavefront measurement can be used for example to indicate the ability to focus a light source to a specific spot size and shape. This is important information when a high SXR flux is needed in a confined and well-defined spot, for example for overlay metrology. If such parameters can be measured quickly, the information can be used in a feedback loop for adaptive control of the SXR beam used in metrology, or for improving the results of a metrology measurement.

Measurement of wavefronts in the extreme ultraviolet (EUV) and soft x-ray (SXR) spectral region is challenging because of high absorption by most materials and the difficulty to fabricate focusing optics. A common approach in the EUV wavebands is to use a Hartmann sensor, which is an array of apertures, to measure the local phase gradient. Examples are described in Mercère et al., Opt. Lett. 28, 1534 (2003), in Künzel et al., Appl. Opt. 54, 4745 (2015), and in published patent application US2004196450A1. Another frequently used approach in the EUV is an interferometric technique called phase-shifting point diffraction interferometry (Naulleau et al., Appl. Opt. 38, 7252 (1999)). Two newer, non-standard techniques are also mentioned. The first technique is based on single slit diffraction measured across the beam profile by scanning the slit (Frumker et al., Opt. Lett. 34, 3026 (2009)). The second technique uses the interference pattern between two identical beams, and reconstructs the wavefront by a lateral shearing algorithm (Austin et al., Opt. Lett. 36, 1746 (2011)).

SUMMARY OF THE INVENTION

The invention aims to improve the monitoring and/or control of operating conditions in a radiation source arrangement, for example an EUV or SXR radiation source, including for example an HHG radiation source arrangement.

The invention aims in another aspect to provide a wavefront sensor with improved compatibility with EUV and SXR wavelengths.

The present invention in a first aspect provides a wavefront sensor for measuring a tilt of a wavefront at an array of locations across a beam of radiation, wherein said wavefront sensor comprises a film having an indent array comprising an indent, indentation or recess at each of said array of locations, such that each indent of the indent array is operable to perform focusing of said radiation.

The present invention in a second aspect provides a radiation source arrangement operable to generate a beam of radiation, the radiation source arrangement further comprising: a wavefront sensor of the first aspect for at least intermittently measuring a tilt of a wavefront at an array of locations across the generated beam of radiation; and a processor for determining an operating condition of the radiation source arrangement based at least partly on the measured wavefront tilt.

The invention further provides an inspection apparatus comprising an illumination system for delivering inspection radiation to a target structure and a detection system for detecting said inspection radiation after interaction with the target structure, and wherein the illumination system includes a radiation source arrangement according to the first aspect of the invention as set forth above.

In any aspect of the invention, the array of locations may be defined by one or more spacing vectors, such that a direction of dispersion of each dispersive element is not parallel with any of said spacing vectors. This allows a desired spatial resolution to be achieved without interference between spectral components from different locations in the array.

The array of locations may be divided into two or more subsets, the dispersive elements of each subset having a different direction of dispersion. This allows a further increase spatial resolution, and/or further separation of the spectral components of the different locations in the array.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying drawings in which.

Figure 1:
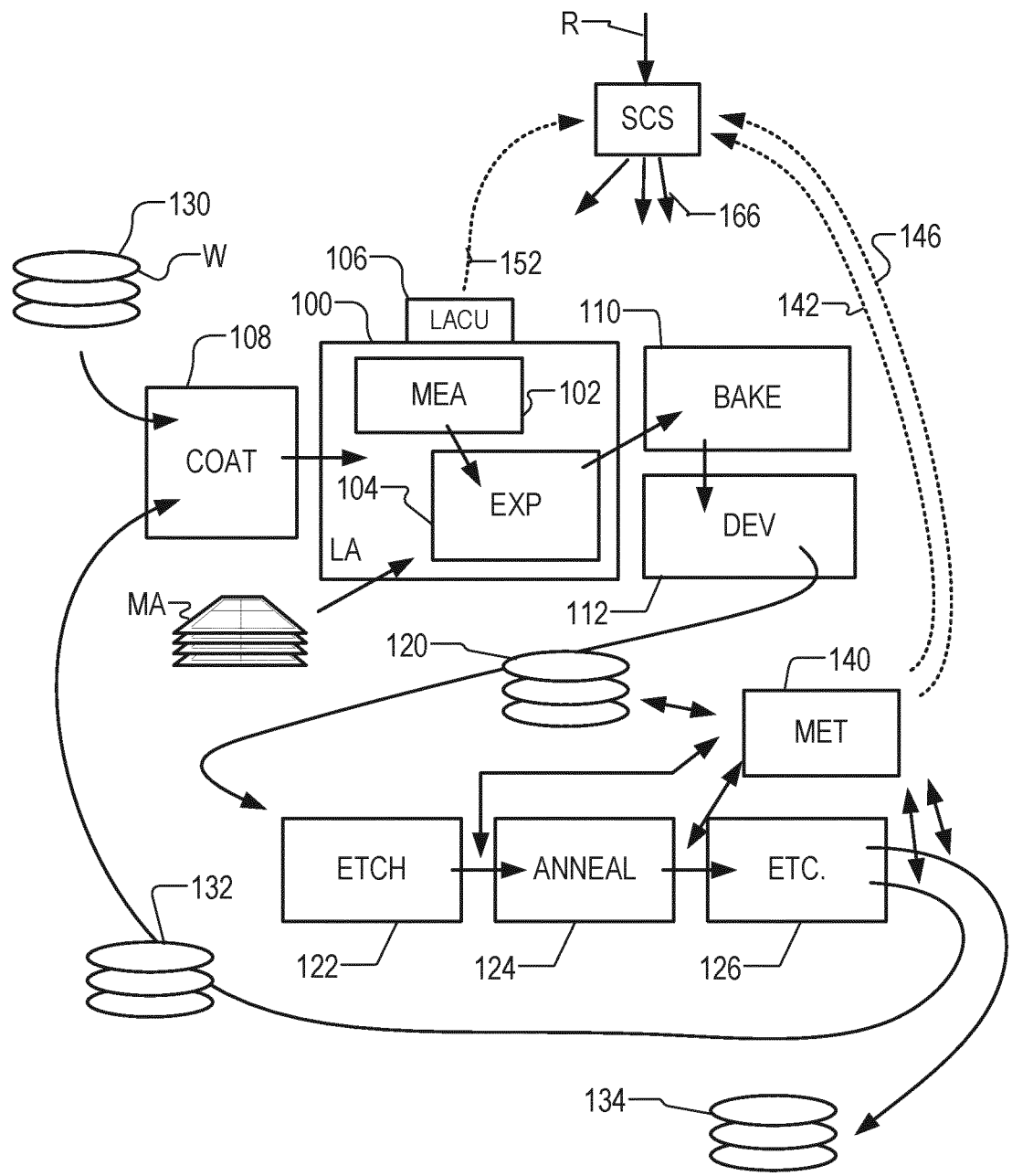
FIG. 1 depicts a lithographic apparatus together with other apparatuses forming a production facility for semiconductor devices, and including a metrology apparatus including an inspection apparatus according to an embodiment of the present invention.
Figure 2:
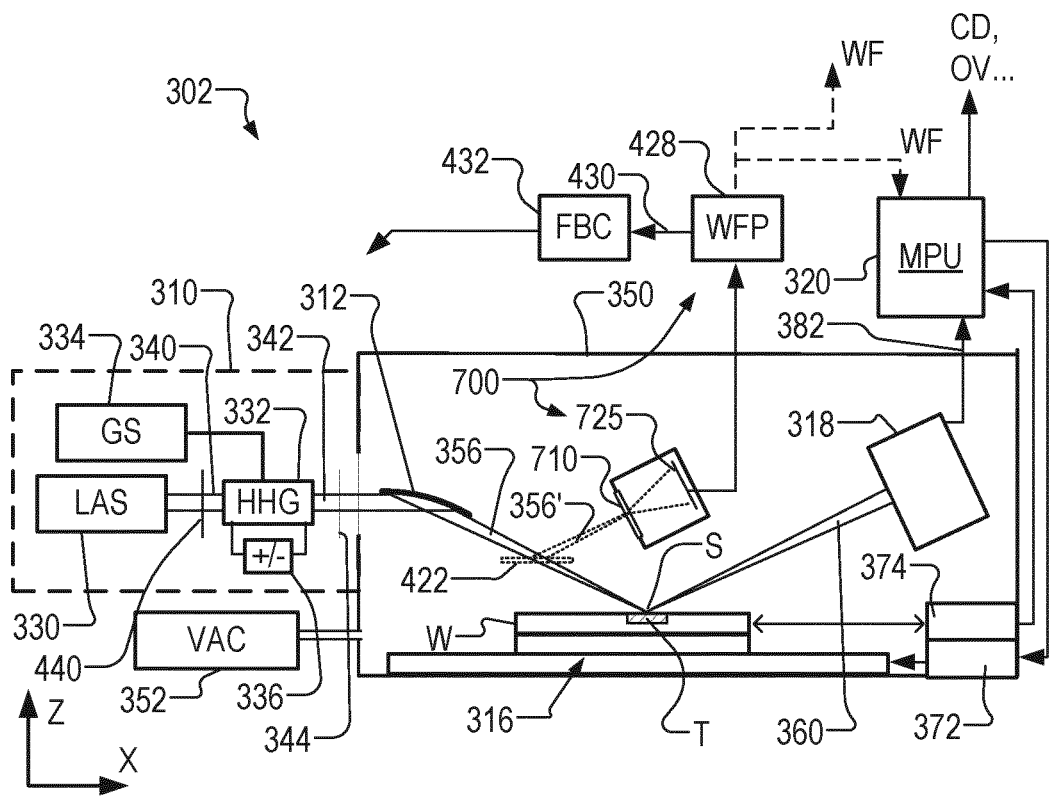
FIG. 2 shows schematically the arrangement of components in a first embodiment of an inspection apparatus including a radiation source arrangement and a wavefront sensor in which the present invention may be applied.
Figure 5:
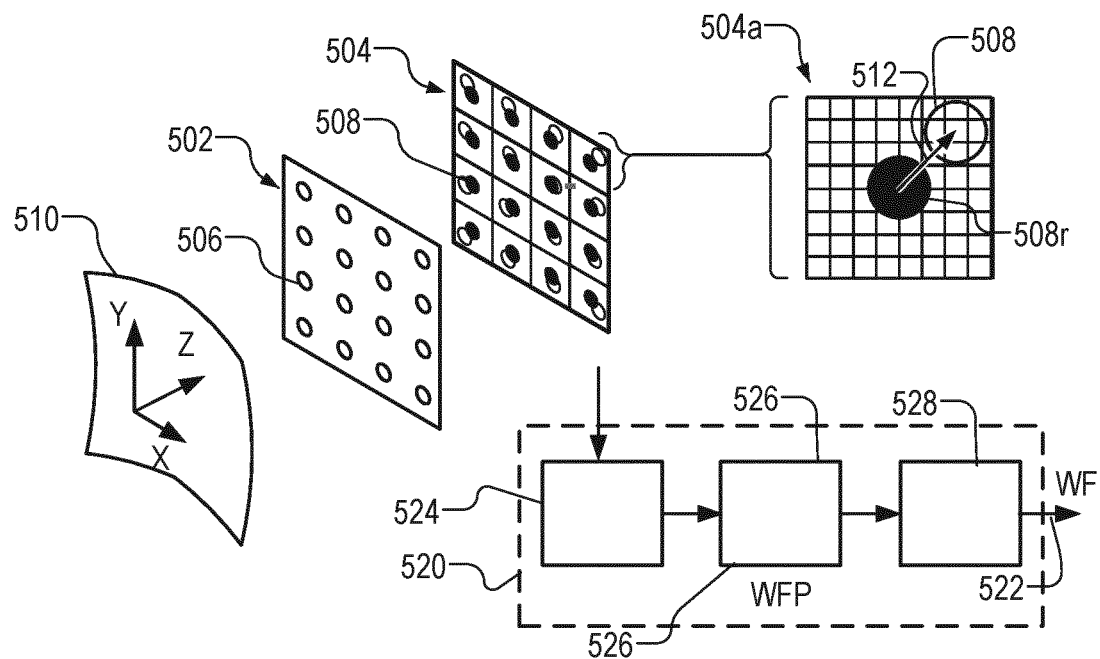
Figure 6:
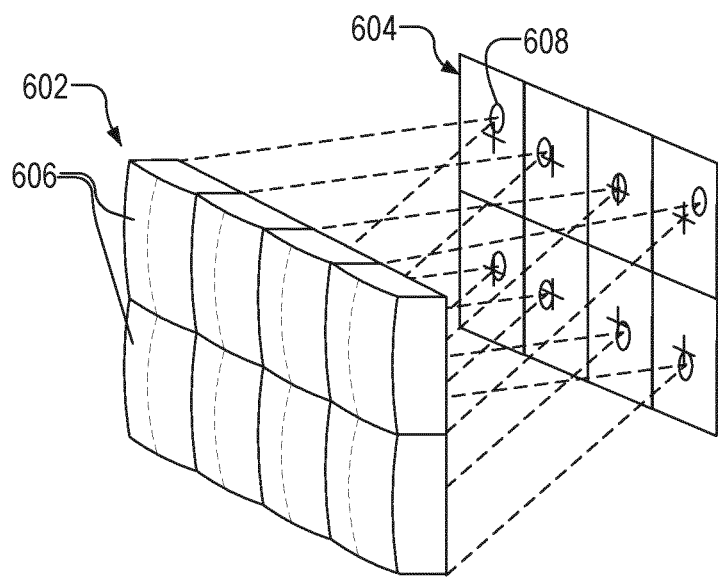
Figure 7A:
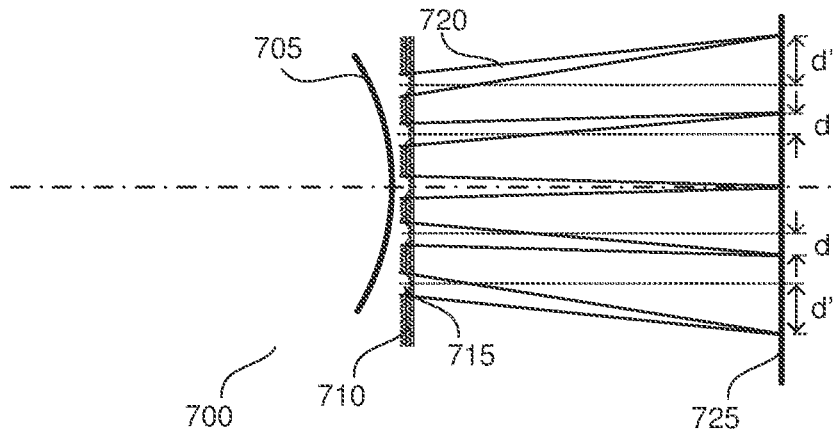
Figure 7B:
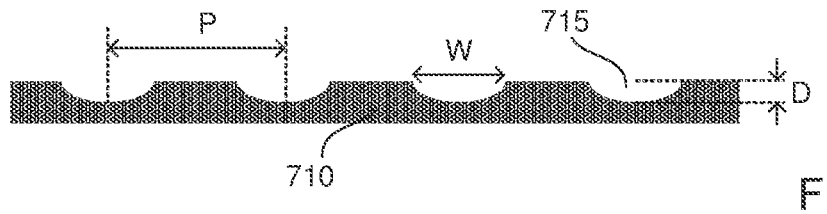
Figure 8:
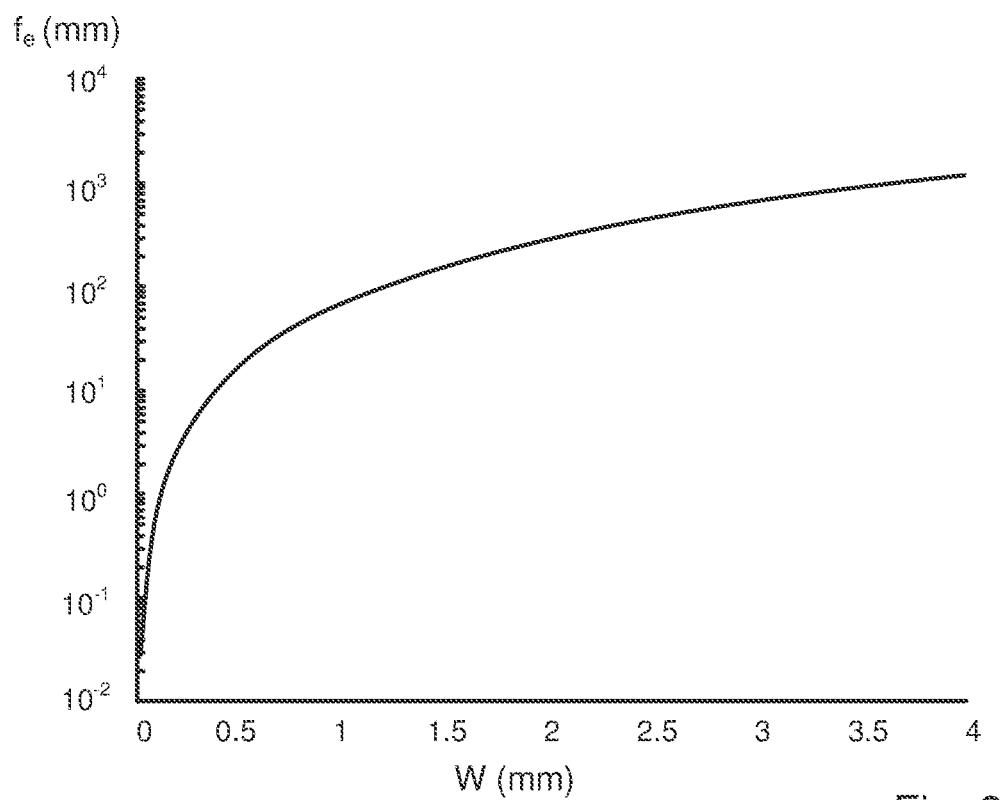
Figure 9A:
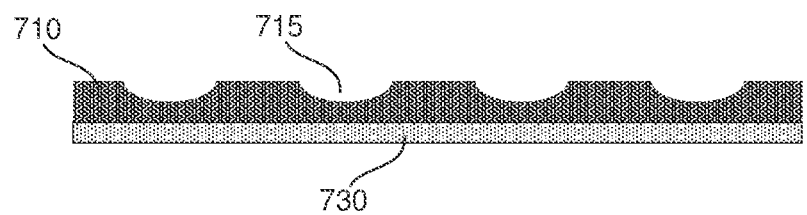
Figure 9B:
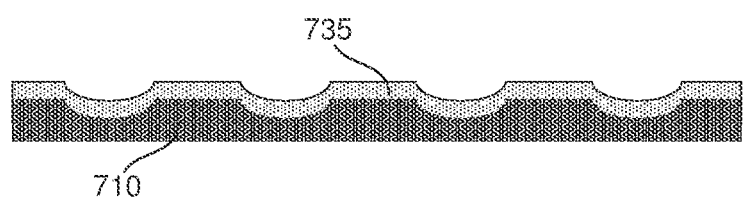
Figure 9C:
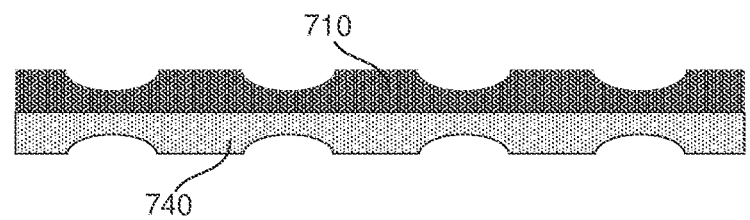
Figure 9D:
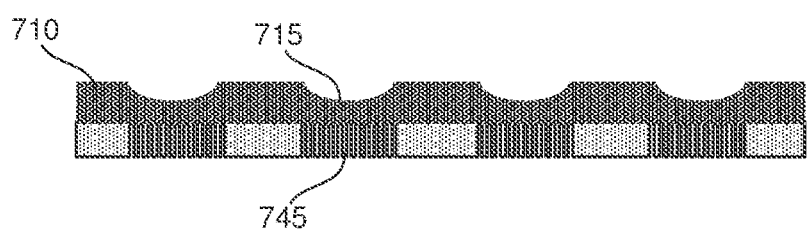
Figure 10:
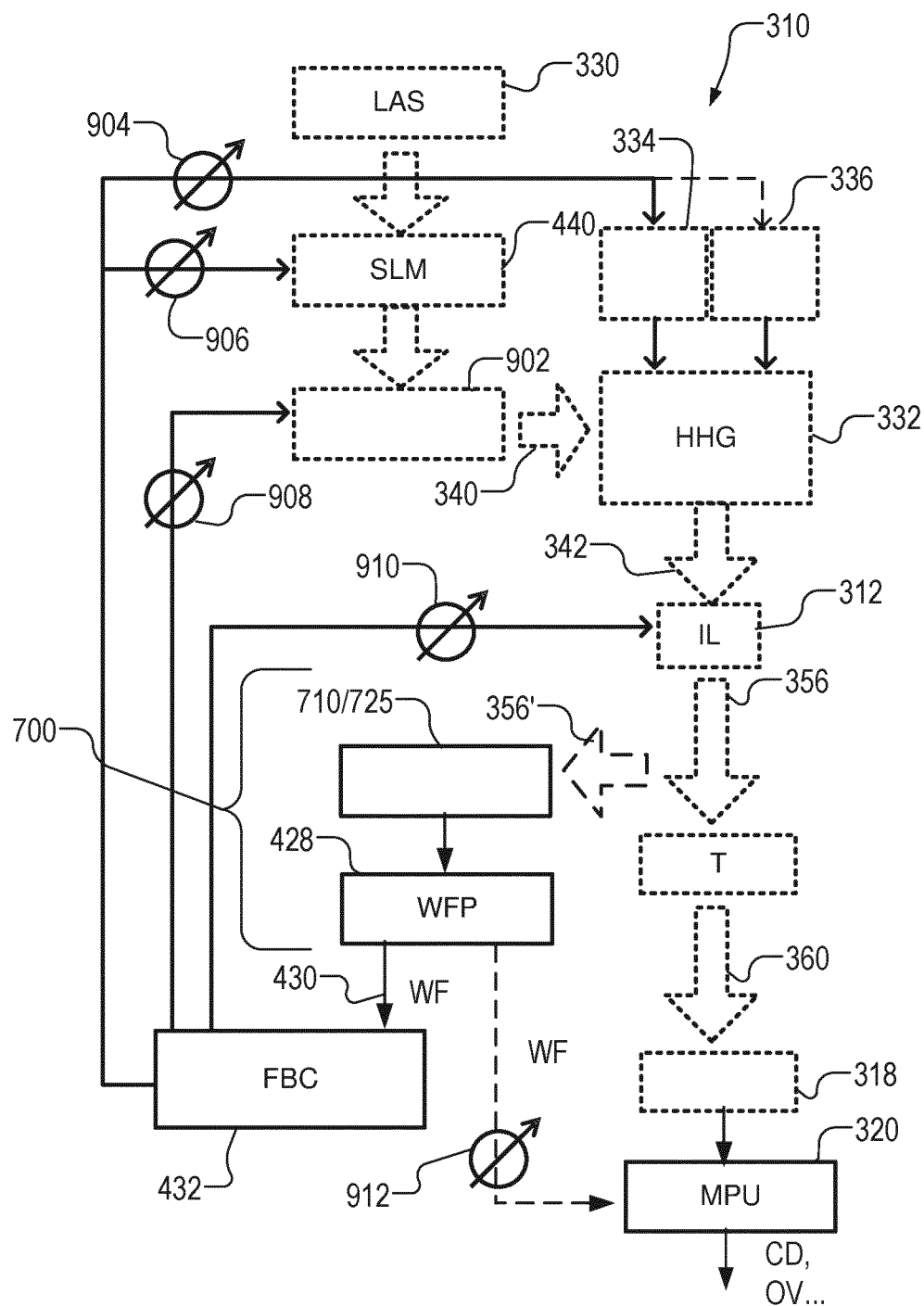
Figure 11:
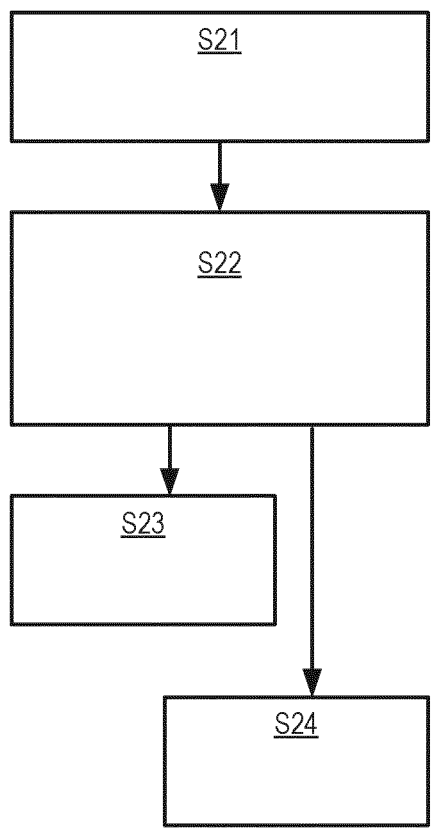

Figure shows a zone of interaction between first radiation and an HHG medium in an example radiation source arrangement;

FIGS. 4(a)-4(d) illustrate some example deviations of operating conditions that can arise in the HHG radiation source arrangement;

FIG. 5 illustrates the principle of operation of a known Hartman-type wavefront sensor;

FIG. 6 illustrates the principle of operation of a known Shack Hartman-type wavefront sensor;

FIGS. 7(a)-7(b) schematically illustrate 7(a) operation of a film-based wavefront sensor according to an embodiment of the invention, and 7(b) a detail of the indent array;

FIG. 8 is a plot describing the relationship between focal length and indent diameter for a particular indent depth and illumination wavelength;

FIGS. 9(a) to 9(d) illustrate four different indent array arrangements usable in embodiments of the invention;

FIG. 10 illustrates schematically the flow of sensor signals and feedback control signals in the inspection apparatus of FIG. 2 according to example embodiments of the present disclosure; and FIG. 11 is a flow chart illustrating a method of controlling performance of a metrology method and/or of a lithographic manufacturing process using measurements made by the inspection apparatus of FIG. 1.

DETAILED DESCRIPTION OF EXEMPLARY EMBODIMENTS

Before describing embodiments of the invention in detail, it is instructive to present an example environment in which embodiments of the present invention may be implemented.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged. This is only one possible arrangement, however, and the measurement station and exposure station need not be so distinct. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, and 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

Metrology apparatus 140 may if desired implement a hybrid metrology system. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122.

Each generation of lithographic manufacturing technology (commonly referred to as a technology "node") has tighter specifications for performance parameters such as CD. One of the main challenges in metrology is that the size of features within the product becomes smaller and smaller, and this smaller feature size should be reflected also in the design of metrology targets. Accordingly, metrology apparatus 140 may include an inspection apparatus designed to operate with radiation at wavelengths shorter than conventional visible or UV wavelengths. As a particular example, soft x-ray (SXR) radiation with wavelengths in the range 1-10 nm or 1-20 nm may be used, or more generally extreme ultraviolet EUV radiation may be used, with wavelengths in the range 1-100 nm or 1-50 nm.

Rather than rely for all purposes on a single inspection apparatus, a variety of inspection apparatuses may be used in practice. A hybrid metrology system may include scatterometers working at different wavelengths, and additional types of inspection apparatus, so that multiple types of measurement can be performed within the hybrid metrology system to obtain a better overall measurement of a parameter or parameters of interest on a given target structure.

Each of the inspection apparatuses within a hybrid metrology system can have a particular illumination system for radiation of a particular characteristic. More detailed examples of the types of apparatuses that can be combined is given in the pending international patent application number PCT/EP2016/080058, mentioned above. For the purposes of the present disclosure, it is assumed that metrology apparatus 140 is an inspection apparatus using soft x-ray (SXR or EUV) radiation in a waveband shorter than 100 nm. This SXR inspection apparatus can be applied as one of the inspection apparatuses in a hybrid metrology system, but can also be applied independently, if desired.

FIG. 2 illustrates a schematic physical arrangement of an inspection apparatus 302 comprising a spectroscopic scatterometer using EUV/SXR radiation in grazing incidence, purely by way of example. An alternative form of inspection apparatus might be provided in the form of an angle-resolved scatterometer, which uses radiation in normal or near-normal incidence similar to the conventional scatterometers operating at longer wavelengths. Inspection apparatus 302 comprises a radiation source 310, illumination system 312, substrate support 316, detection system 318 and metrology processing unit (MPU) 320. Source 310 in this example comprises a generator of EUV or soft x-ray radiation based on high harmonic generation (HHG) techniques. Such sources are available for example from KMLabs, Boulder Colorado, USA (http://www.kmlabs.com/). Main components of the radiation source are a drive laser 330 and an HHG gas cell 332. A gas supply 334 supplies suitable gas to the gas cell, where it is optionally ionized by an electric source 336. The drive laser may be for example a fiber-based laser with an optical amplifier, producing pulses of infrared radiation that may last for example less than 1 ns (1 nanosecond) per pulse, with a pulse repetition rate up to several megahertz, as required. The wavelength of the infrared radiation may be for example in the region of 1 µm (1 micron). The laser pulses are delivered as a first radiation beam 340 to the HHG gas cell 332, where in the gas a portion of the radiation is converted to higher frequencies than the first radiation into a beam 342 including coherent second radiation of the desired wavelength or wavelengths.

The second radiation may contain multiple wavelengths. If the radiation were monochromatic, then measurement calculations (for example reconstruction) may be simplified, but it is easier with HHG to produce radiation with several wavelengths. The volume of gas within the gas cell 332 defines an HHG space, although the space need not be completely enclosed and a flow of gas may be used instead of a static volume. The gas may be for example a noble gas such as neon (Ne) or argon (Ar). $N_2$, $O_2$, He, Ar, Kr, Xe gases can all be considered, either singly or in mixtures. These are matters of design choice, and may even be selectable options within the same apparatus. Different wavelengths will, for example, provide different levels of contrast when imaging structure of different materials. For inspection of metal structures or silicon structures, for example, different wavelengths may be selected to those used for imaging features of (carbon-based) resist, or for detecting contamination of such different materials. One or more filtering devices 344 may be provided. For example a filter such as a thin membrane of Aluminum (Al) may serve to cut the fundamental IR radiation from passing further into the inspection apparatus. A grating (not shown) may be provided to select one or more specific harmonic wavelengths from among those generated in the gas cell. Some or all of the beam path may be contained within a vacuum environment, bearing in mind that SXR radiation is absorbed when traveling in air. The various components of radiation source 310 and illumination optics 312 can be adjustable to implement different metrology 'recipes' within the same apparatus. For example different wavelengths and/or polarization can be made selectable.

Depending on the materials of the structure under inspection, different wavelengths may offer a desired level of penetration into lower layers. For resolving the smallest device features and defects among the smallest device features, then a short wavelength is likely to be preferred. One or more wavelengths in the range 1-20 nm or 1-10 nm may be chosen, for example. Wavelengths shorter than 5 nm suffer from very low critical angle when reflecting off materials typically of interest in semiconductor manufacture. Therefore to choose a wavelength greater than 5 nm will provide stronger signals at higher angles of incidence. On the other hand, if the inspection task is for detecting the presence of a certain material, for example to detect contamination, then wavelengths up to 50 nm could be useful.

From the radiation source 310, the filtered beam 342 enters an inspection chamber 350 where the substrate W including a structure of interest is held for inspection by substrate support 316. The structure of interest is labeled T. The atmosphere within inspection chamber 350 is maintained near vacuum by vacuum pump 352, so that EUV radiation can pass with-out undue attenuation through the atmosphere. The illumination system 312 has the function of focusing the radiation into a focused beam 356, and may comprise for example a two-dimensionally curved mirror, or a series of one-dimensionally curved mirrors, as described in international application number PCT/EP2016/080058, mentioned above. The focusing is performed to achieve a round or elliptical spot S less than 10 μm in diameter, when projected onto the structure of interest. Substrate support 316 comprises for example an X-Y translation stage and a rotation stage, by which any part of the substrate W can be brought to the focal point of beam to in a desired orientation. Thus the radiation spot S is formed on the structure of interest.

Reflected radiation 360 is captured by detector 318 and a spectrum is provided to processor 320 for use in calculating a property of the target structure T. The illumination system 312 and detection system 318 thus form an inspection apparatus. This inspection apparatus may comprise an SXR spectroscopic reflectometer of the kind described in US2016282282A1. Tilting of the substrate in one or more dimensions may also be provided.

To aid the alignment and focusing of the spot S with desired product structures, inspection apparatus 302 may also provide auxiliary optics using auxiliary radiation under control of metrology processor 320. Metrology processor 320 can also communicate with a position controller 372 which operates the translation stage and rotation stages. Metrology processor 320 receives highly accurate feedback on the position and orientation of the substrate, via sensors. Sensors 374 may include interferometers, for example, which can give accuracy in the region of picometers. In the operation of the inspection apparatus 302, spectrum data 382 captured by detection system 318 is delivered to metrology processing unit 320.

As mentioned an alternative form of inspection apparatus uses SXR radiation at normal incidence or near-normal incidence, for example to perform diffraction-based measurements of asymmetry. Both types of inspection apparatus could be provided in a hybrid metrology system. Performance parameters to be measured can include overlay (OVL), critical dimension (CD), coherent diffraction imaging (CDI) and at-resolution overlay (ARO) metrology. The SXR radiation may for example have wavelengths less than 100 nm, for example using radiation in the range 5-30 nm. The radiation may be narrowband or broadband in character.

Like the optical scatterometer used in today's production facilities, the inspection apparatus 302 can be used to measure structures within the resist material treated within the litho cell (known as After Develop Inspection or ADI), and/or to measure structures after they have been formed in harder material (known as After Etch Inspection or AEI). For example, substrates may be inspected using metrology apparatus 302 after they have been processed by the developing apparatus 112, etching apparatus 122, annealing apparatus 124 and/or other apparatus 126.

Figure 3:
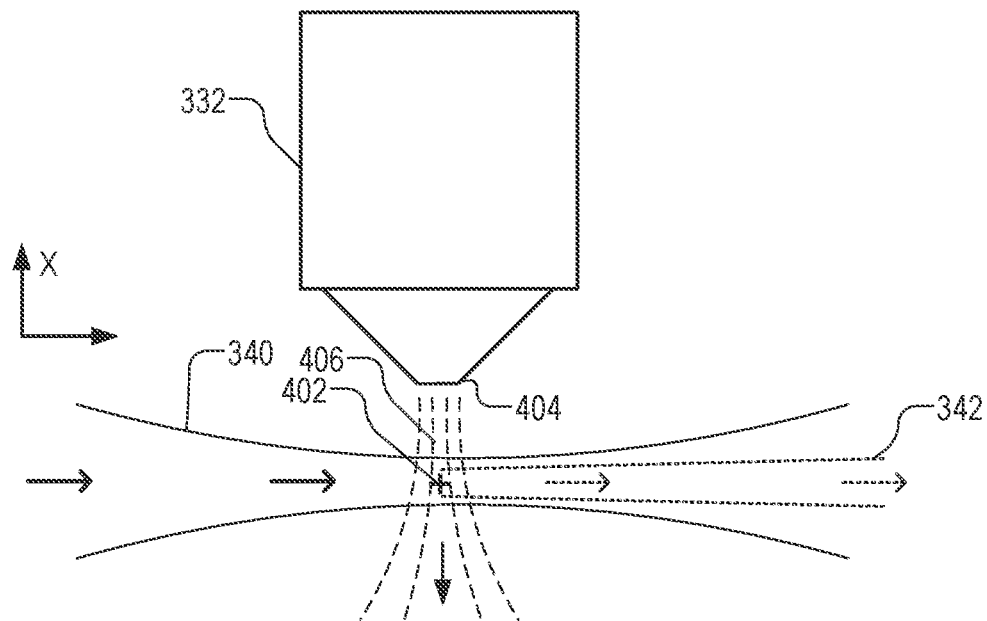
Figure 4A:
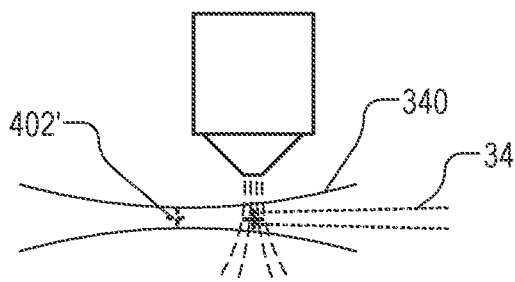
Figure 4B:
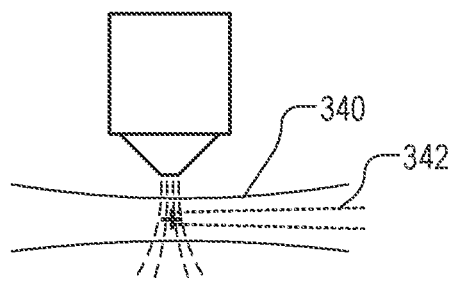
Figure 4C:
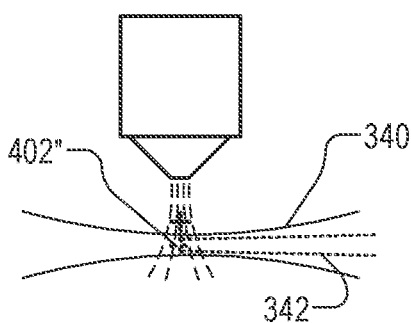
Figure 4D:
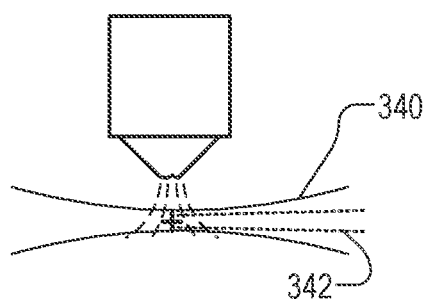

FIG. 3 shows the principle of operation of the Higher Harmonics Generation (HHG) source. In such a source, a high power femtosecond pulsed IR laser (the drive laser 330) generates the first radiation beam 340. As indicated schematically by solid lines in FIG. 3, beam 340 is focused at a point 402 in the HHG generation space. A nozzle 404 emits a jet of gas 406 containing the Ne, Ar or other atoms which are to interact with the first radiation. Around the focus position, the large, oscillating electric field caused by the first radiation displaces electrons from the gas atoms. On recombination, an energetic photon is produced, synchronously with the pump radiation but with higher harmonic energy. This results in the beam 342 of second radiation (dotted lines). Since the SXR/EUV photons of interest have a very short penetration depth in any medium, the gas jet is located in a vacuum chamber that is constantly pumped to low pressure. In another type of HHG radiation source arrangement, the gas is confined together with the pump radiation within an elongated light guide. Principles of operation are the same in either case.

The application of inspection apparatus based on HHG radiation sources in a high-volume manufacturing facility requires a degree of control and stability of the HHG radiation source arrangement beyond that provided by the manual set-up procedures and short running times of existing sources. It may be expected that the characteristics like position, shape and size of the pump radiation focus with respect to the gas jet as well as the geometric shape, flowrate, pressure and stability of the gas jet itself are important parameters to create a high power, stable output of wanted radiation.

FIG. 4 illustrates schematically some deviations in the operating condition that may degrade the operation of the HHG radiation source arrangement. In FIG. 4 (a) the pump radiation is focused at a point 402' displaced from the gas jet, leading to a loss of maximum amplitude of the electric field within the gas jet and consequently to possible failure/degradation of the HHG process. At (b) the pump radiation is imperfectly focused, leading again to a loss of maximum amplitude of the electric field. At (c), the pump radiation is focused at a point 402" within the gas jet, but displaced from the designed location 402. The form of the gas jet may be different at this point, leading to possible failure/degradation of the HHG process, and/or leading to the second radiation 342 being position incorrectly relative to the illumination system 312. At (d) the pump radiation is focused at the desired location, but the condition of the gas jet is degraded, for example due to a wrong pressure, or wear of the nozzle, again leading to possible failure/degradation of the HHG process. These four examples are only some of the deviations that can arise. Currently, most of the parameters mentioned above are adjusted by hand while evaluating the (wavelength dependent) intensity of the generated EUV light.

The present disclosure aims to enable the provision of a more industrially-applicable source arrangement, with automatic feedback loops to stabilize and optimize the EUV output. Wear conditions other than nozzle wear may also arise, including wear of optical components that are exposed to ions from the HHG process. Such components may include vacuum system entrance windows, and pump radiation focusing optics, if it is inside the vacuum. Other conditions that may be considered "wear" conditions include variations of the gas composition and gas purity. A controlled mixture of gases may be used, which varies over time, or impurities can accumulated, for example if the gas is recycled for economic reasons.

Referring again to FIG. 2, the present application proposes to provide one or more sensors for monitoring the operating condition of the HHG radiation source arrangement and the illumination system, by sensing a wavefront of the radiation beam 356 (in some embodiments for a plurality of spectral components). Various embodiments will be described, each purely by way of example. In the illustrated example, wavefront sensor 700 receives at least a portion 356' of the focused beam 356 via a beam diverter 422. That is to say, the wavefront sensor in this example receives a portion of the second radiation 342 at a point that is downstream of a last focusing element in the illumination system 312. In this way the wavefront sensor can be used to obtain information about operating conditions in the HHG generation space, but also taking into account the properties of the illumination system 312. In other embodiments, the wavefront sensor may receive radiation 342 from upstream of a focusing element, or there may be no focusing element.

Beam diverter 422 may be a beam splitter which diverts a portion of the beam 356 to the sensor while a main portion of the beam continues to form the spot S on the target T. In this way the wavefront sensor can operate continuously, simultaneously with measurements of the target. In other embodiments, beam diverter 422 may be a movable element which is placed intermittently in the path of the beam 356, so that the wavefront sensor operates only in between measurements of the target, and measurements of the target are conducted with minimal loss and disturbance of the second radiation 342. In the example where second radiation 342 has a wavelength in the SXR or EUV waveband, it will be understood that transmissive optical elements are difficult to provide. However, a beam splitter can be implemented as very thin multilayer device, or a very thin metal film. In the example of a movable element, a multilayer reflector may be envisaged, or even a metal surface.

As will be described, the wavefront sensor 700 comprises an indent array or thin indented film 710, arranged in the path of the radiation beam 356', and a detector or image sensor 725 for capturing a 2-dimensional spot pattern created by the indent array. Each indent of the indent array is a recess. A wavefront processor 428 receives from the detector 725 image signals (analog or digital data) representing the spot pattern, and derives wavefront information WF from the information of the spot pattern. One or more signals 430 (analog or digital data) representing operating conditions of the radiation source arrangement and illumination system may be produced.

In some embodiments of the modified wavefront sensor disclosed herein, the wavefront information WF is both spectrally resolved and spatially resolved. The wavefront information can be used by a controller 432 to implement automatic feedback control loops for controlling the operation of the radiation source arrangement 310. Alternatively or in addition, the signals representing operating conditions of the radiation source arrangement can be monitored for diagnostic purposes, for example to detect fault conditions of wear conditions, and to interrupt operation urgently, or to schedule maintenance operations. Alternatively or in addition, the wavefront information can be used in the metrology processor 320 to influence the processing of the spectrum data 382 to produce more accurate measurements of parameters of interest. Other types of sensor can be used in addition, to provide further information about operating conditions.

Examples of operating parameters that can be controlled in the radiation source 310 will be described further below. As an example, FIG. 2 shows a compensatory optical device 440 for wavefront correction in the path of the first radiation 340 upstream of the HHG cell 332. European patent application EP3296723 (incorporated herein by reference), describes the correction of wavefronts to correct for a "slope error" of the illumination system 312 optical element(s) in an inspection apparatus, and therefore minimize blurring of the measurement spot. EP3296723 describes embodiments in which calibration to correct this slope error is a one-time calibration: once the compensatory optical device is configured, it is not expected to require further adjustment. In such an embodiment, the calibration step may be performed only once during construction. In other embodiments, the calibration step may have to be repeated periodically. To allow real-time, closed-loop control of the wavefront, compensatory optical device 440 may be a programmable spatial light modulator (SLM). Needless to say, the real implementation of the beam delivery system may include several optical elements, and not a single lens as suggested in the simplified drawing. Note that the drawing suggests a transmissive SLM device purely for simplicity of illustration. Because of the power in the laser beam, the practical implementation may use a reflective type SLM (e.g. a digital micromirror device (DMD) array).

Wavefront Sensor Background

FIG. 5 shows the principle of operation of a conventional Hartman type wavefront sensor. An aperture array 502 is positioned in the path of a beam of radiation, and an image sensor 504, for example a CCD or CMOS image sensor. Aperture array 502 comprises for example a metal plate with apertures 506 spaced in a regular array in a plane defined by dimensions X and Y. Radiation approaching the wavefront sensor nominally in the Z direction passes through the aperture array and so forms an array of spots 508 on the image sensor 504, also oriented in an X-Y plane. If the beam of radiation had an ideal flat wavefront, so that it comprised only parallel rays perfectly in phase and perfectly aligned with the Z axis, each spot would be formed exactly behind the corresponding aperture 506. A real beam, on the other hand, will have some form of tilt and/or curvature, such as the convex wavefront 510 illustrated in the drawing. In that case, the wavefront is tilted in a particular way at each location in the aperture array and the corresponding spot 508 will be formed on the image sensor 504 with a positional deviation dependent on that tilt. Relative positional deviations can be observed and measured, even when an absolute "zero deviation" position of the spots is no known.

An enlarged portion of image sensor 504 is shown at 504a, showing one spot 508 (open circle) and also showing a reference position 508r (solid circle) for the same spot. Image sensor 504 comprises an array of photodetector elements (pixels) having sufficient spatial resolution (sufficient pixel density) that the deviation 512 of the actual spot 508 from the reference position 508r can be detected and quantified in two dimensions, for each aperture 506 of the aperture array. A wavefront processor 520 receives image data from the image sensor 504 and outputs wavefront information 522. Wavefront processor 520 will typically be implemented by programming a suitable programmable processor, and may operate for example in a number of stages. A first processing stage 524 analyzes an image from image sensor 504 to detect the positions of the spots 508. A second stage 526 compares the positions of the spots 508 with their reference positions 508r to determine a local tilt for the wavefront 510 at each location in the aperture array. The third stage 528 integrates and interpolates the array of local tilts to obtain a model of the entire wavefront. This wavefront model can be output as an example of wavefront information. It may be represented as an array of local tilt vectors, and/or as a parameterized model, for example using Zernike or other polynomial representations.

FIG. 6 illustrates part of a known Shack-Hartman wavefront sensor. This operates on exactly the same principles as the Hartman sensor shown in FIG. 5, and like parts have like reference numbers, only with prefix '6' instead of prefix '5'. The main difference in the Shack-Hartman sensor is that an array 602 of focusing elements such as miniature lenses 606 (lenslets or microlenses) is provided, instead of an array of simple apertures 606. This results in an improvement in the amount of light captured, enhancing the intensity of the spots 608 on the image sensor 604. The increase in captured light results in a reduced acquisition time and/or an increase in the achieved measurement accuracy. The local wavefront tilt detected by the spot position becomes the average of the tilt across the area of the focusing element, rather than at one small aperture. It is assumed that the wavefront is relatively smooth on the scale of the array.

It should be noted that that, while the aperture array 502 shown in FIG. 5 is implemented by an array of actual apertures, transmitting radiation as illustrated, the same function could be implemented by an array of reflective spots, reflecting radiation locally. Either implementation is valid for the present disclosure, though each will bring its own practical benefits and challenges in implementation. Similarly, an array 602 of focusing elements 606 may be conventionally implemented by transmissive lenslets, but could also be implemented by a shaped reflective surfaces. Focusing by diffraction (using Fresnel zone plates, either reflective or transmissive) is yet another option, in principle. The reflective options could be more practical if such a wavefront sensor is to be designed for EUV/SXR wavelengths, where refractive elements are not readily available. However, none of these arrangements is ideal (reflective lenslets provide their own problems). The proposed film-based wavefront sensor (below), aims to inter alia address the issue of focusing on the detector, when using EUV/SXR radiation.

Another point to note about the conventional wavefront sensors is that they use monochrome image sensors 504, 604. Therefore there is no resolution of different spectral components that may have different wavefront shapes. Prior attempts to add spectral resolution do so only at the expense of reduced spatial resolution, and are not compatible with all wavelengths, such as the EUV and SXR wavelengths.

Film-Based Wavefront Metrology Device

In view of the above issues, a film-based wavefront metrology device or wavefront sensor is proposed, which addresses many of the issues of measuring the wavefront of EUV radiation (e.g., between 0.01-100 nm, 0.1-100 nm, 1-100 nm, 1-50 nm, 5-30 nm, 1-20 nm or 10-20 nm wavelength), such as that produced by an HHG source. Optional embodiments of the film-based wavefront sensor will also provide for sufficient spectral resolution to separately measure different wavelengths of broadband EUV radiation (e.g., from a broadband HHG source). The proposed film-based wavefront sensor uses an indented film of suitable material, comprising an indent array, focus said radiation at or in the vicinity of a detection plane (e.g., the detector). In the vicinity of the detection plane may comprise within 1 cm, or within 1 mm of the detection plane, for example.

One issue with a conventional Hartman type wavefront sensor (such as illustrated in FIG. 5) is that, in order to obtain accurate wavefront determination, the apertures need to be small with respect to the total beam size. For example, the aperture diameter may be limited to a diameter in the region of 50 micrometers. As a result, the amount of light transmitted through the apertures is very small. This results in long data acquisition times and less accurate measurements (e.g., the determination of the center of the spot on the detector is inaccurate). Partly addressing this using a lenslet array provides its own problems when using EUV/SXR radiation, as has already been described.

Another disadvantage of the conventional Hartman sensor is that, when being used to measure a broad-band spectrum, the detected spots relating to different wavelengths will overlap on the detector and cannot be disentangled. The source output of the described HHG source is anticipated to have different wavefront characteristics per wavelength. This not only hampers accurate wavefront measurement using a conventional sensor; also the wavelength dependent information could be used to also provide additional useful information which is instead lost. A method for broadband wavefront detection was described L. Freisem, G. S. M. Jansen, D. Rudolf, K. S. E. Eikema and S. Witte, *Spectrally resolved single-shot wavefront sensing of broadband high-harmonic sources*, Opt. Express 26, 6: 6860-6871 (2018). This describes providing a small transmission- or phase-grating within each aperture of the aperture array, to disperse the light per aperture to the +1 and −1 diffraction orders. As a result, the diffraction orders relating to different wavelengths no longer overlap, and the wavefront per wavelength can be determined. However, placing gratings within the apertures further reduces the amount of light transmitted through each aperture. The detected diffraction orders per color contain only a small fraction of the total light transmitted through a single hole, this being only a portion of the broadband light, with further losses due to the grating's diffraction efficiency.

Whether narrow-band or broad-band, providing more apertures (increasing the aperture density) in the aperture array will provide, in principle, a better wavefront estimation (notably enabling higher order variations to be detected). However, this will also result in greater difficulty in accurately determining the spot positions due to crosstalk between the spots on the detector. This is particularly an issue when gratings are provided within the apertures, as each aperture provides a series of spots on the detector for all diffracted wavelengths.

The proposed film-based wavefront sensor increases the amount of harvested light per aperture, and in total, using a Hartmann-like sensor concept. The approach can be used in a narrow-band configuration (e.g., without gratings) or a broad-band configuration (e.g., with gratings) depending on the characteristics of the radiation being measured, and/or the desired characteristic being determined form the radiation.

FIG. 7 illustrates the film-based wavefront sensor 700 for performing metrology of a wavefront 705. FIG. 7(a) shows the sensor arrangement comprising a thin indented film 710 comprising an array of indents 715. FIG. 7(b) shows a detail of a section of the thin indented film 710. Each indent 715 may be part-spherical shaped, or otherwise optimized for focusing radiation 720 onto a detector 725. As shown in FIG. 7(b), each indent 715 has a depth D and diameter W, and the indents 715 are spaced apart by pitch P. One, some or all of these parameters may be optimized for wavefront metrology (e.g., depending on the characteristics of the radiation being measured, and/or any particular application). For example, the diameter W of each indent may be greater than 100 μm, greater than 200 μm, greater than 300 μm or greater than 500 μm. The basic operation of the film-based wavefront sensor 700 is the same as the Hartman sensor already described, i.e., the wavefront 705 is characterized by the displacements d, d' of the spots detected by detector 725 with respect to their nominal positions had the incident radiation been perfectly collimated. It should be noted that the term array (as in indent array and array of locations) should not be narrowly defined as a regular array. While such an array will typically be substantially regular, this is not necessary. The term array in this context, should be understood to encompass, for example, irregular arrays (irregular patterns), non-orthogonal arrays, random arrays/arrangements etc.

In the embodiment as shown in FIG. 7, the array of indents 715 is in a surface plane and in one side of the thin indented film 710. The one side means one of the top side and the bottom side of the film. In another embodiment, the array of indents 715 may be in an interface plane and in one side or two sides of the thin indented film 710, which may comprise multiple layers, as shown by the example in FIG. 9(b). In another embodiment, the array of indents 715 may be in a surface or interface plane and in both sides of the thin indented film 710, as shown by the example in FIG. 9(c). Both sides here means the two opposite sides i.e. both the top side and the bottom side of the film.

The thin indented film 710 should be comprised of a material or multiple materials having suitable properties for good transmission of the radiation 720 with a focusing effect onto the detector 725. As such, the material should have a refractive index having a real part which is lower than unity (n<1) and as small as possible to provide the maximize optical contrast, and a complex part optimized for transmission of the radiation used (e.g., EUV/SXR radiation between 1 nm and 100 nm or between 1 nm and 50 nm or between 1 nm and 20 nm or between 10 and 20 nm wavelength) and a normal or near-normal angle of incidence (e.g., less than 20 degrees, less than 10 degrees or less than 5 degrees from normal). As the real part of the refractive index is small but non-negligible, there is refraction on the curved surface of the indent 715, and as n<1 at the wavelengths of interest, the concave indent will act as a positive lens to focus the radiation 720 onto the detector 725. As such, for 13.5 nm radiation (for example), a material having a value for n below 0.999, below 0.99, below 0.98, below 0.97, below 0.96 or below 0.95 would be suitable, for example. The film should be substantially transmissive for the wavelengths of interest. As such, the value for k (the extinction coefficient) should be minimal at EUV wavelengths, e.g., below 0.4, below 0.2, below 0.15 or below 0.13 for 13.5 nm radiation. Another potentially relevant factor is dispersion, which should be minimized when the radiation is broadband, such that all wavelengths are focused on the same detector plane. Dispersion is less important in a narrowband application e.g., when using an additional aluminum layer for filtering (as described below) or a narrow-band source is used.

In one embodiment, the wavelength range over which the real part of the refractive index is below unity is between 0.01 and 50 nanometers, optionally between 1 and 50 nanometers, optionally between 1 and 20 nm, optionally between 8 and 22 nm, optionally between 13 and 14 nm.

In one embodiment, the film has extinction coefficient below 0.2 for at least part of a radiation range of 1-50 nm or 1-20 nm, optionally said film has extinction coefficient below 0.1 for at least part of a radiation range of 1-50 nm or 1-20 nm, optionally said film has extinction coefficient below 0.05 for at least part of a radiation range of 1-50 nm or 1-20 nm.

As such, the three key parameters are:
Low dispersion;
Refractive index as small as possible (<1); and
Low absorption (for broadband applications, at least).

Suitable materials for the thin indented film 710 include, for example, MgO, Co, Ni, Cu, Zr, Zn, Ga, Ge, As, Cd, In, Pb, Bi, C, Y and Sc, and different aspects of the disclosure each comprise a thin indented film 710 being comprised of one of each of these materials or multiple of these materials. A more detailed consideration of these materials will now be described.

Materials with low dispersion include MgO, Co, Ni, Cu, Zr, Zn, Ga, Ge, As, Cd, In, Pb and Bi; however some of these have a higher absorption than is desirable or a refractive index very close to 1 (e.g. Ge). From these, materials those which have relatively low absorption over the whole wavelength range of interest (and therefore a particularly suitable) are MgO, Zr, Zn, Ga, and Ge, while Cd, In, Sn, Ni, Cu, Co, Pb and Bi have quite a low absorption at the lower end of the range (e.g., 10 nm) but increasing significantly towards the upper end of the range (e.g., 20 nm). These latter examples therefore may be candidates for smaller wavelengths only. Other possible candidates, having very low absorption and reasonably low refractive index include C, Y and Sc. However these have quite high dispersion, and therefore are only really suited for narrowband applications. Low dispersion in the context may comprise a dispersion lower than one or all of C, Y and Sc for the wavelength bands of interest. MgO and Ga have both low dispersion and low extinction, with MgO having the smallest refractive index. Co, Ni, Cu, Zn, Cd, In and Pb have low dispersion and a small refractive index. Zr, As, C, Y and Sc have low extinction coefficient. Bi may be the option for a narrower range.

The low dispersion may be quantified as the ratio $n_{\_max}/n_{\_min}$, while $n_{\_max}$ and $n_{\_min}$ are the maximum and minimum refractive index respectively. In one embodiment the low dispersion is smaller than 2 optionally smaller than 1.5. In one embodiment, the range for low dispersion is 1-20 nm, optionally 10-20 nm.

In one embodiment, a material e.g. Zirconium, may be disqualified as a material of choice for a full wavelength range e.g. 10-20 nm, but for a portion of the full wavelength range the material e.g. Zirconium, will still work.

A suitable, tested, material which meets the criteria is Zirconium (Zr). This shows low absorption (good transmission) of EUV radiation for feasible film thicknesses (e.g., a total film thickness of a few hundred nanometers). In one embodiment, the film thickness is less than 1 μm. In one embodiment, the film thickness is 100 nm. In one embodiment, the film thickness is less than 100 nm. As such, the specific examples given below will assume a Zirconium thin indented film 710. This, however, is only an example and any other suitable material which meets the criteria described may be used.

In one embodiment, the wavelength is smaller than 1 nm, and for some materials the refractive index may be below unity but still close to unity, for example: the refractive index of Zr is 0.999 at 1 nm and 0.99999 at 0.1 nm. The practical implementation is relatively difficult for this embodiment.

The focal distance is related to the gradient of the indent and thus to the depth D and diameter W of the indent. FIG. 8 is a plot of effective focal length $f_c$ (mm) against indent diameter W (mm), illustrating an estimation of the effective focal length of an indent of D=400 nm as a function of aperture diameter W, for 13.5 nm radiation. As can be seen, a compact configuration can be obtained as the focal length is within 100 mm for apertures as large as W=1 mm (note that the detector position L can be larger than the focal length for a diverging incident beam). The thickness D will lead to a transmission loss at the edges of 75% with respect to the center of the aperture, which is still quite acceptable. Of course a smaller aperture diameter W and a smaller depth D can be chosen should a higher transmission be desired. To put it into context, a diameter of 500 μm is ten times greater than the aperture diameter of a typical, comparable Hartmann array presently used for wavefront sensing, leading to a 100 times increase in harvested radiation per aperture. In addition, focusing of the radiation enables the indents to be positioned much closer to each other compared to the apertures of a typical Hartmann array, providing a denser array (smaller pitch P). This enables determination of much higher orders of wavefront aberrations. In an embodiment, diameter W may be approximately equal to pitch P in a fully packed configuration. The total transmission of the indent array will then be in the order of 50%.

FIG. 9 illustrates a number of different embodiments for the thin indented film. Each of the alternative indented films illustrated and described may be used in place of the thin indented film 710 in the film-based wavefront sensor 700 illustrated in FIG. 7. FIG. 9(*a*) shows an arrangement where a substrate or coating 730 is applied to the thin indented film 710; i.e., on the non-indented side of the film 710. The substrate or coating 730 may comprise a single layer of material or a complex multilayer. In an embodiment, such a coating can provide mechanical stability. A suitable material for to achieve this may be a Silicon Nitride such as $Si_3N_4$. Alternatively or in addition, the substrate or coating 730 may be provided for bandwidth filtering. By way of a specific example, all wavelengths below 18 nm will be blocked by an aluminum layer, while the Zirconium indented film 710 blocks all wavelengths above 20 nm. Therefore the coated film will act as a narrowband-pass filter, enabling wavefront metrology on a narrowband using a broadband source. It will be apparent that other materials may be used depending on the radiation spectral characteristics of the source and the desired bandwidth filtering.

FIGS. 9(*b*) and 9(*c*) illustrate another embodiment, which uses the optical properties of another material having a different refractive index (for example aluminum or niobium) to correct for chromatic aberrations resultant from the indents. The focal length is dependent on wavelength (chromatic aberrations) due to the dispersion in the refractive index of Zirconium. By adding a layer 735 of this other material on top of the Zirconium indented film 710 (FIG. 9(*b*)) or a similarly indented layer 740 below the Zirconium indented film 710 (FIG. 9(*c*)), chromatic aberrations can be optimized to an extent allowed by the optical properties of the additional material. Negative dispersion materials which may be used in such an additional layer 735, 740 so as to compensate chromatic aberrations include In, Sn, Sb and Te.

The previously described concept of using gratings to obtain wavelength dependent information on the wavefront of a broadband source can be combined with the indented film concept. This is particularly beneficial as HHG sources are by nature broadband. FIG. 9(*d*) shows an arrangement where each indent 715 of the indented film 710 is provided with a dispersive element such as a diffraction grating 745. It should be noted that in this embodiment, the radiation will be incident from the grating side (from below as shown in FIG. 9(*d*)), first diffracting on the grating 745 and then being immediately focused by the indents 715; i.e., the indented film 710 will be reversed with respect to that shown on FIG. 7. It should also be appreciated that dispersion in Zirconium will result in different focal distances; however the detector can be placed at an average distance such that at least partial focusing takes place. Due to the focusing, less spectral resolution is required from the grating, hence the grating can have a larger pitch and/or a higher spectral power can be achieved. The smaller diffraction angles for each wavelength per indent allow for a greater indent density (more indents per array) without the diffraction orders from the various indents overlapping. Note that the gratings 745 can each comprise an amplitude grating or a phase grating.

Application Examples

A number of application examples will now be described. This section will describe in detail the monitoring and/or adjusting of parameters relating to the radiation source. However, these are simply for example, and there are many other possible applications for the proposed film-based wavefront sensor. Other applications, for example, relate to alignment and/or monitoring of the illumination optics, and the concepts herein apply equally to using the output of the wavelengths sensor in such applications.

In any of the above examples, the information obtained from the film-based wavefront sensor 700 can be used to monitor and/or adjust numerous parameters of the operating radiation source arrangement. Examples of parameters and conditions that can be monitored in real time (and adjusted automatically or manually) include:

1) Direction of the pump radiation
2) Positioning of the pump radiation focus
3) The wave front of the pump radiation (for example by modifying or reprogramming a Spatial Light Modulator 440)
4) Gas flow settings, nozzle shape and other gas jet parameters
5) Gas jet nozzle deterioration
6) Gas composition and purity Since the wavefront sensor in this example is positioned downstream of the focusing arrangement in the illumination system 312, parameters and conditions within the illumination system can be monitored, either separately, or as parameters of the radiation source and illumination system combination.

FIG. 10 is an example block diagram of a control system of the radiation source arrangement and the inspection apparatus of FIG. 2. Components identifiable in the hardware drawings of FIG. 2 are shown in dashed lines and labeled with the same reference signs. For example, the drive laser 330, the wavefront compensating device (SLM) 440 and the gas 406 are represented, and the pump radiation (first radiation) 430 and the output EUV radiation (second radiation) 432. A laser beam delivery system 902 is illustrated. Wavefront sensor 700 receives at least a portion 356' of the EUV radiation 356 which is simultaneously or intermittently being directed at target T. Wavefront information 430 from wavefront sensor 700 is processed by feedback controller 432. As schematically represented at 904, 906, 908 and 910, operating parameters of the hardware elements are adjusted by feedback processor 432 (or separate feedback processors) to implement feedback control and stabilize operation of the radiation source arrangement and/or the illumination system over a prolonged period.

A wide range of mechanisms can be implemented in the feedback controller, based on analysis and/or empirical observation of the behavior and observation. Examples of feedback actions can include:

Movement of drive laser focusing lens and/or gas jet position along the drive laser axis can be controlled in response to changes in divergence, spatial coherence properties and/or spectral width of harmonics.

Transverse movement of the drive laser focusing lens or angle of incident drive laser beam direction can be controlled in response to changes in the direction of HHG beam, indicated by wavefront tilts.

The gas pressure in the HHG interaction zone can be controlled in response to changes in phase matching properties, derived from observed intensity and spectral content of the HHG beam.

The drive laser intensity, for example the peak intensity, can be controlled in response to changes in HHG radiation intensity and, optionally, spectral content.

The Spatial shape of the drive laser beam can be varied (either through an adjustable aperture or a spatial light modulator 440) in response to changes in divergence and spatial properties of HHG radiation beam and, optionally, intensity).

Laser pulse shape and duration can be changed by changing the pulse compressor in a laser amplifier system, by adding dispersion into the beam, or by pulse shaping devices such as spatial light modulator 440, all in response to changes in HHG radiation intensity and spectral content.

The functions of hardware control can be implemented in the same processing hardware as the deriving of operating conditions from the wavefront sensor signals. This may also be combined with the wavefront processor itself and/or the metrology processor 320. In other implementations, processing of monitoring signals and control functions may be implemented in separate processing hardware. Once the captured diffraction images signals are digitized, the analysis of them to derive operating conditions and/or to determine appropriate feedback control actions can be implemented by suitable programming, with fixed responses and/or adaptive and machine learning responses.

As also mentioned, alternatively or in addition to controlling the radiation source arrangement 310 and/or illumination system 312, the wavefront information can be supplied at 912 to the metrology processor 320. Here it can be used to modify calculations of properties of the target T and/or performance parameters of the lithographic process. For example, the processing of signals from detector 318 can be based on particular assumptions about the wavefront shape and/or (where measured) the spectral properties of the radiation beam 356. It may be assumed for example that the beam comprises a particular mix of spectral components with respective wavefront shapes and intensities. When the wavefront information is obtained showing the actual wavefront shape and intensity for different spectral components at different locations across the beam, the calculations of the properties of interest can be adjusted and made more accurate. Therefore the wavefront sensor can be used to improve stability of the radiation source arrangement or to improve robustness of the measurements made by the metrology apparatus, or both.

In association with the hardware components of the inspection apparatus, an embodiment may therefore include a computer program containing one or more sequences of machine-readable instructions and/or functional data describing the a method of determining an operating condition of a radiation source arrangement, and/or for controlling the radiation source arrangement in response to the determined condition. This computer program may be executed for example within metrology processing unit MPU in the apparatus of FIGS. 2 to 12 and/or the supervisory control system SCS of Figure. There may also be provided a non-transient data storage medium (e.g., semiconductor memory, magnetic or optical disk) having such a computer program stored therein. Where an existing radiation source arrangement is already in production and/or in use, a modified embodiment can be implemented by the provision of an updated computer program product for causing a processor to perform one or more of the methods described herein.

Further modifications of the laser radiation delivery system and other components of the HHG radiation source can be included, which are not detailed herein. Some of these modifications are disclosed for example in European patent application EP3321739. Other modifications are disclosed in international patent application WO2017/108410. European patent application EP3296723 has already been mentioned. The contents of all these applications are incorporated herein by reference, and the techniques described therein can be used in combination with the techniques of the present disclosure.

While the present disclosure presents EUV and SXR radiation between 10-20 nm as an example of particular interest for current technological development, shorter wavelengths in the "harder" x-ray range may be used, having wavelengths for example less than 10 nm, less than 1 nm and potentially less than 0.1 nm. While inspection by reflection of radiation is described by way of example, the principles of the present disclosure may also be applied in transmissive arrangements, particularly where shorter x-ray radiation can penetrate through the whole substrate.

FIG. 11 illustrates the application of an inspection apparatus such as inspection apparatus 302, in the control of a lithographic manufacturing system of the type illustrated in FIG. 1. The steps will be listed here, and then explained in more detail:

S21: Process wafer to produce structures on substrate
S22: Measure CD and/or other parameter across substrate
S23: Update metrology recipe
S24: Update lithography and/or process recipe At step S21, structures are produced across a substrate using the lithographic manufacturing system. At S22, the metrology apparatus 140 and optionally other metrology apparatus and information sources are used to measure a property of the structures across the substrate. In accordance with the principles of the present disclosure, set forth above, properties of one or more targets are measured using EUV or SXR radiation generated by a radiation source arrangement monitored and controlled as described above.

At step S23, optionally, metrology recipes and calibrations of the metrology apparatus are updated in light of the measurement results obtained. A metrology recipe might specify which portions of the diffraction spectra to compare for the most reliable asymmetry measurement. The recipe may specify settings of the laser radiation delivery system also, for example to control spectrum and/or polarization of the SXR radiation. The recipe may also indicate how spectrally resolved wavefront information is to be used to improve accuracy of the metrology apparatus.

At step S24, measurements of overlay or other performance parameters are compared with desired values, and used to update settings of the lithographic apparatus and/or other apparatus within the lithographic manufacturing system.

CONCLUDING REMARKS

In the above there is disclosed a modified form of wavefront sensor which acts as a lenslet array in the EUV/SXR wavelength regime. The wavefront sensor provides for high transmission and therefore short acquisition times with high accuracy. The wavefront sensor has a high spatial resolution of the wavefront orders, and also (optionally) provides for spectrally resolved measurements. The proposed wavefront sensor also has a compact design.

The wavefront sensor can support improved monitoring and control of a radiation source arrangement. The wavefront sensor can support more accurate calculation of measurements, when a metrology apparatus is dependent on the qualities of a radiation beam produced by an arrangement. Sufficiently fast measurement to provide complete EUV beam information on timescale of an overlay measurement, for example, in high volume manufacturing.

While the description above describes only metrology applications for the wavefront sensor, other applications can also be envisaged. For example, a lithographic apparatus (exposure apparatus or scanner (e.g., one which exposes using EUV radiation)) may also make use of the wavefront sensor disclosed herein.

No additional EUV spectrometer is needed to obtain spectral selectivity, because the gratings are integrated in the Hartmann mask. Polarization-sensitive wavefront measurements in the EUV become possible.

The principles of the present disclosure may be applied in any wavelength range, although it is particularly applicable in the EUV/soft-X-ray region where source stability is a needed development, and where optical wavefront sensing methods such as interferometry are problematic.

The aperture array and dispersive elements can be made transmissive or reflective, without deviating from the principles. A variant that works in reflection may comprise for example a grazing incidence conical diffraction configuration. This has advantages in terms of manufacturability and robustness, and gives a completely different parameter space for diffraction geometry and contrast. An analysis of conical diffraction of EUV radiation in grazing incidence is provided in the paper C. Braig, L. Fritzsch, T. Käsebier, E.-B. Kley, C. Laubis, Y. Liu, F. Scholze, and A. Tünnermann, "An EUV beamsplitter based on conical grazing incidence diffraction," Opt. Express 20, 1825-1838 (2012).

Implementation of the wavefront processing can be straightforward. Diffraction spots corresponding to a single wavelength are localized by a chosen numerical method, after which the wavefront reconstruction for each spectral component can proceed through established conventional reconstruction routines for Hartmann/Shack-Hartmann wavefront sensors.

The wavelength range, spectral resolution and wavefront curvatures that can be characterized with a given mask (aperture array) depend on the geometric parameters (hole sizes and positions, grating pitch, distance to camera, sensor pixel size, etc. Focusing elements can be substituted for an array of apertures, or added to an array of aperture. Such focusing elements can be made the focus elements, either in reflective or transmissive form (wavelength permitting), and the same applies to the dispersive elements. Spectral resolution can be obtained by dividing the wavelength spectrum into as few as two spectral components, or many hundreds. Each spectral component could be defined by a very broadband of wavelengths, or by a very narrowband, according to what is practical, and what is required for a given purpose.

Optionally, the sensor can be scanned relative to the beam to increase the spatial resolution of the wavefront, e.g. if the desired spectral range and spectral resolution demand a large spacing between the individual holes/gratings. Compared to other scanning configurations, the inherent spatial resolution of the wavefront sensor means that the required scanning range is small (about the distance between the apertures).

Modeling of the expected diffraction by the aperture array would extend the ability to characterize complex wavefronts and complex spectra. For example, understanding the shape of every spot (which relates to the shape of the apertures), allowing a more precise determination of the center positions.

The principles of the present disclosure can be applied with EUV sources such as high-harmonic generation sources, but also with less coherent sources such as (spatially filtered) plasma discharges.

Polarization sensitivity can also be included in the approach. If the grating diffraction efficiency is polarization-dependent, orienting a subset of the gratings in the orthogonal direction can sample the local polarization state of the wavefront. Alternatively, the mask or other component defining the aperture array can be rotated by 90 degrees for a second measurement. Gratings with a more complex shape and orientation could be considered, to achieve a similar effect. In other words, measuring the relative intensities of the spots that are associated with these different subsets/orientations will give some information about the polarization state of the radiation beam, with some spatial resolution across the beam. Polarization sensitivity of the gratings can also be introduced by tuning the grating pitch, mask thickness and choice of materials for the mask.

By using blazed gratings, one diffraction order can be suppressed, and this allows for a more dense packing (and hence, increased resolution) of the holes/gratings in the sensor.

Further embodiments are provided in the subsequent numbered clauses:

1. A wavefront sensor for measuring a tilt of a wavefront at an array of locations across a beam of radiation, wherein said wavefront sensor comprises a film having an indent array comprising an indent at each of said array of locations, such that each indent of the indent array is operable to perform focusing of said radiation.
2. The wavefront sensor of clause 1, wherein the indents array is arranged in at least one of
   a surface plane,
   an interface plane,
   one side, and
   both sides
   of the film.
3. The wavefront sensor of clause 1 or 2, wherein the film is a transmissive film being operable to substantially transmit the wavefront.

4. The wavefront sensor of any preceding clause, wherein said film has a real part of a refractive index lower than unity, optionally for at least part of a radiation range of 1-50 nm.
5. The wavefront sensor of clause 4, wherein said real part of the refractive index is lower than 0.99 for at least part of a radiation range of 1-50 nm.
6. The wavefront sensor of clause 4, wherein said real part of the refractive index is lower than 0.97 for at least part of a radiation range of 1-50 nm.
7. The wavefront sensor of clause 4, wherein said real part of the refractive index is lower than 0.96 for at least part of a radiation range of 1-50 nm.
8. The wavefront sensor of any preceding clause, wherein said film has a minimal extinction coefficient for wavelengths in the range of 1 to 50 nm, optionally said film has extinction coefficient below 0.2 for at least part of a radiation range of 1-50 nm.
9. The wavefront sensor of clause 8, wherein said film has extinction coefficient below 0.1 for at least part of a radiation range of 1-50 nm.
10. The wavefront sensor of clause 8, wherein said film has extinction coefficient below 0.05 for at least part of a radiation range of 1-50 nm.
11. The wavefront sensor of any preceding clause, wherein said film has low dispersion.
12. The wavefront sensor of clause 11, wherein said film has dispersion smaller than 2, optionally smaller than 1.5, for at least part of a radiation range of 1-50 nm, optionally 1-20 nm, optionally 10-20 nm.
13. The wavefront sensor of any preceding clause, wherein said film comprises at least one of MgO, Co, Ni, Cu, Zr, Zn, Ga, Ge, As, Cd, In, Pb, Bi, C, Y and Sc.
14. The wavefront sensor of any preceding clause, wherein said film is comprised of Zirconium.
15. The wavefront sensor of any preceding clause, wherein each of said indents are concave.
16. The wavefront sensor of any preceding clause, wherein each of said indents are part-spherical.
17. The wavefront sensor of any preceding clause, wherein the film has a thickness less than 1 µm.
18. The wavefront sensor of any preceding clause, wherein the film has a thickness of 100 nm.
19. The wavefront sensor of any preceding clause, wherein the film has a thickness less than 100 nm.
20. The wavefront sensor of any preceding clause, wherein the diameter of each indent is greater than 100 µm.
21. The wavefront sensor of any preceding clause, wherein the diameter of each indent is greater than 300 µm.
22. The wavefront sensor of any preceding clause, wherein the diameter of each indent is greater than 500 µm.
23. The wavefront sensor of any preceding clause, wherein the diameter of each indent is substantially equal to the separation between indents.
24. The wavefront sensor of any preceding clause, each indent of the indent array is operable to focus said radiation at or in the vicinity of a detection plane.
25. The wavefront sensor of clause 20, further comprising a detector located at said detection plane.
26. The wavefront sensor of any preceding clause, wherein said film comprises a substrate or coating comprising one or more layers.
27. The wavefront sensor of clause 22, wherein at least one of the one or more layers comprises a material optimized for mechanical stability of the film.
28. The wavefront sensor of clause 23, wherein the material optimized for mechanical stability of the film comprises silicon nitride.
29. The wavefront sensor of clause 22, 23 or 24, wherein at least one of the one or more layers comprises a material optimized for blocking a particular spectral band.
30. The wavefront sensor of clause 25, wherein said material optimized for blocking a particular spectral band comprises aluminum.
31. The wavefront sensor of any of clauses 22 to 26, wherein said substrate or coating is optimized for correcting chromatic aberrations.
32. The wavefront sensor of clause 27, wherein said substrate or coating optimized for correcting chromatic aberrations comprises different refractive index than the film and a compensatory indent array corresponding to said indent array of said film.
33. A wavefront sensor as defined in any preceding clause, wherein each of said indents of the indent array is provided with a dispersive element for directing spectral components of the beam of radiation in different directions.
34. A wavefront sensor as defined in clause 29, wherein said dispersive elements are diffraction gratings.
35. A wavefront sensor as defined in clause 29 or 30, wherein said wavefront sensor is operable to compute a wavefront tilt for each spectral component at each location in the array based on detection of the positive and negative diffraction orders of that spectral component.
36. A radiation source arrangement operable to generate a beam of radiation, the radiation source arrangement further comprising:
   a wavefront sensor as defined in any preceding clause for at least intermittently measuring a tilt of a wavefront at an array of locations across the generated beam of radiation; and
   a processor for determining an operating condition of the radiation source arrangement based at least partly on the measured wavefront tilt.
37. A radiation source arrangement as defined in clause 32, wherein the processor is arranged to use the measured wavefront tilts to determine an operating condition of the radiation source arrangement.
38. A radiation source arrangement as defined in clause 32 or 33, wherein the generated beam of radiation includes wavelengths shorter than 23 nm.
39. A radiation source arrangement as defined in clause 32, 33 or 34, further comprising a controller for adjusting at least one operating parameter of the radiation source arrangement and/or at least one alignment parameters of the illumination optics automatically in response at least partly to the operating condition determined by the processor.
40. A radiation source arrangement as defined in clause 35, arranged to cause an interaction between first radiation and a medium and thereby to generate said beam of radiation by higher harmonic generation.
41. A radiation source arrangement as defined in clause 36 wherein the medium is a gaseous medium.
42. A radiation source arrangement as defined in clause 36 or 37 wherein the adjusted operating parameter is an operating parameter of a source and/or beam delivery system of the first radiation, such as a pulse intensity or duration beam width, an axial focus position, a transverse focus position or a wavefront.

43. A radiation source arrangement as defined in clause 37 or 38 wherein the adjusted operating parameter is a parameter of the medium.
44. A radiation source arrangement as defined in clause 39 wherein the medium is a gas jet and the adjusted operating parameter is an operating parameter of a gas delivery system.
45. A radiation source arrangement as defined in any preceding clause wherein said processor is operable to output diagnostic information based at least partly on the determined operating condition.
46. A radiation source arrangement as defined in clause 41 wherein the medium is a gas jet and the diagnostic information relates to a wear condition of a part of the radiation source arrangement.
47. An inspection apparatus comprising an illumination system for delivering inspection radiation to a target structure and a detection system for detecting said inspection radiation after interaction with the target structure, and wherein the illumination system includes a radiation source arrangement as defined in any of clauses 32 to 43, the generated beam of radiation being used as said inspection radiation.
48. An inspection apparatus as defined in clause 43 wherein the inspection radiation includes wavelengths shorter than 23 nm.
49. An inspection apparatus as defined in clause 44 further comprising a processing arrangement for determining a property of the target structure based on detected inspection radiation.
50. An inspection apparatus as defined in clause 46 wherein said processing arrangement is further arranged to calculate a first performance parameter of a lithographic process based at least partly on the determined property of the target structure.
51. An inspection apparatus as defined in clause 46 or 43 wherein said processing arrangement is arranged to determine said property of the target structure and/or said first performance parameter based further on an output of the wavefront sensor.
52. An inspection apparatus as defined in any of clauses 43 to 47 wherein said wavefront sensor is arranged to receive a portion of the inspection radiation continuously while another portion of the inspection radiation interacts with the target structure.
53. An inspection apparatus as defined in any of clauses 43 to 47 wherein said wavefront sensor is arranged to receive at least a portion of the inspection radiation intermittently at times other than while the inspection radiation interacts with the target structure.
54. An inspection apparatus as defined in any of clauses 43 to 49 wherein said wavefront sensor is arranged to receive at least a portion of said inspection radiation downstream of a focusing element of said illumination system.

In the application to metrology, the target structures described above may be metrology targets specifically designed and formed for the purposes of measurement, in other embodiments, properties may be measured on targets which are functional parts of devices formed on the substrate. Many devices have regular, periodic structures akin to a grating. The term "target", "grating" or "periodic structure" of a target as used herein does not require that the applicable structure has been provided specifically for the measurement being performed. Further, the pitch of the metrology target may be close to the resolution limit of the optical system of the measurement tool or may be much larger than the dimension of typical product features made by a patterning process in the target portions C. In practice the features and/or spaces of the gratings may be made to include smaller structures similar in dimension to the product features.

Although specific reference is made to "metrology apparatus/tool/system" or "inspection apparatus/tool/system", these terms may refer to the same or similar types of tools, apparatuses or systems. E.g. the inspection or metrology apparatus that comprises an embodiment of the invention may be used to determine characteristics of structures on a substrate or on a wafer. E.g. the inspection apparatus or metrology apparatus that comprises an embodiment of the invention may be used to detect defects of a substrate or defects of structures on a substrate or on a wafer. In such an embodiment, a characteristic of interest of the structure on the substrate may relate to defects in the structure, the absence of a specific part of the structure, or the presence of an unwanted structure on the substrate or on the wafer.

Although specific reference may have been made above to the use of embodiments in the context of optical lithography, it will be appreciated that embodiments of the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A wavefront sensor for measuring a tilt of a wavefront at an array of locations across a beam of radiation, wherein the wavefront sensor comprises:
   a film comprising first and second opposing surfaces;
   a detector; and
   an indent array in at least one of the surfaces of the film, wherein the indent array comprises a recessed indent at each location of the array of locations, and wherein each indent of the indent array is configured to focus a portion of the beam of radiation onto the detector.

2. The wavefront sensor of claim 1, wherein the indent array is arranged in at least one of:

a surface plane,
an interface plane,
one side, and
both sides of the film.

3. The wavefront sensor of claim 1, wherein the film is a transmissive film being operable to substantially transmit the wavefront.

4. The wavefront sensor of claim 1, wherein at least one of:
the film has a real part of a refractive index lower than unity for at least part of a radiation range of 1-50 nm,
the real part of the refractive index is lower than 0.99 for at least part of the radiation range of 1-50 nm,
the real part of the refractive index is lower than 0.97 for at least part of the radiation range of 1-50 nm, or
the real part of the refractive index is lower than 0.96 for at least part of the radiation range of 1-50 nm.

5. The wavefront sensor of claim 1, wherein at least one of:
the film has an extinction coefficient below 0.2 for at least part of a radiation range of 1-50 nm,
the film has an extinction coefficient below 0.1 for at least part of the radiation range of 1-50 nm, or
the film has an extinction coefficient below 0.05 for at least part of the radiation range of 1-50 nm.

6. The wavefront sensor of claim 1, wherein the film has dispersion smaller than 2 or smaller than 1.5, for at least part of a radiation range of 1-50 nm, 1-20 nm, or 10-20 nm.

7. The wavefront sensor of claim 1, wherein the film comprises at least one of MgO, Co, Ni, Cu, Zr, Zn, Ga, Ge, As, Cd, In, Pb, Bi, C, Y, and Sc.

8. The wavefront sensor of claim 1, wherein each of the indents are concave or partly spherical.

9. The wavefront sensor of claim 1, wherein the film has a thickness less than 1 μm, the film has a thickness of 100 nm, or the film has a thickness less than 100 nm.

10. The wavefront sensor of claim 1, wherein a diameter of each indent is greater than 100 μm, greater than 300 μm, or greater than 500 μm.

11. The wavefront sensor of claim 1, wherein a diameter of each indent is substantially equal to a separation between indents.

12. The wavefront sensor of claim 1, wherein each indent of the indent array is operable to focus the beam of radiation at or in the vicinity of a detection plane.

13. The wavefront sensor of claim 1, wherein each of the indents of the indent array is provided with a dispersive element for directing spectral components of the beam of radiation in different directions, or the dispersive elements are diffraction gratings.

14. A radiation source arrangement operable to generate a beam of radiation, the radiation source arrangement further comprising:
a wavefront sensor of claim 1 for at least intermittently measuring a tilt of a wavefront at an array of locations across the generated beam of radiation; and
a processor configured to determine an operating condition of the radiation source arrangement based at least partly on the measured wavefront tilt.

15. An inspection apparatus comprising an illumination system for delivering inspection radiation to a target structure and a detection system for detecting the inspection radiation after interaction with the target structure, and wherein the illumination system includes a radiation source arrangement of claim 14, the generated beam of radiation being used as the inspection radiation.

* * * * *

UNITED STATES PATENT AND TRADEMARK OFFICE
CERTIFICATE OF CORRECTION

PATENT NO. : 11,815,402 B2
APPLICATION NO. : 17/425646
DATED : November 14, 2023
INVENTOR(S) : Van Der Post et al.

It is certified that error appears in the above-identified patent and that said Letters Patent is hereby corrected as shown below:

In the Specification

In Column 1, Line 8, delete "2019 Jan. 25" and insert -- Jan. 25, 2019 --, therefor.

In Column 3, Line 60, delete "Figure" and insert -- FIG. 3 --, therefor.

In Column 9, Line 29, delete "with-out" and insert -- without --, therefor.

In Column 12, Line 63, delete "no" and insert -- not --, therefor.

In Column 20, Line 11, delete "the a" and insert -- the --, therefor.

Signed and Sealed this
Eleventh Day of June, 2024

Katherine Kelly Vidal
*Director of the United States Patent and Trademark Office*